United States Patent
Sung et al.

(10) Patent No.: US 8,323,739 B2
(45) Date of Patent: *Dec. 4, 2012

(54) METHOD FOR FORMING A METAL PATTERN ON A SUBSTRATE

(75) Inventors: Yuh Sung, Taoyuan (TW); Ming-Der Ger, Taoyuan (TW); Chang-Ping Chang, Taoyuan (TW); Chun-Chieh Tseng, Taoyuan (TW); Wen-Ding Chen, Taoyuan (TW)

(73) Assignee: National Defense University, Bade, Taoyuan (TW)

( * ) Notice: Subject to any disclaimer, the term of this patent is extended or adjusted under 35 U.S.C. 154(b) by 1050 days.

This patent is subject to a terminal disclaimer.

(21) Appl. No.: 11/979,760

(22) Filed: Nov. 8, 2007

(65) Prior Publication Data
US 2009/0041941 A1 Feb. 12, 2009

(51) Int. Cl.
C23C 18/18 (2006.01)
C23C 18/30 (2006.01)
C23C 18/34 (2006.01)
C23C 18/40 (2006.01)
B05D 5/00 (2006.01)

(52) U.S. Cl. ..... 427/265; 427/98.5; 427/99.1; 427/99.5; 427/261; 427/304; 427/305; 427/306

(58) Field of Classification Search ............... 427/98.5, 427/265
See application file for complete search history.

(56) References Cited

U.S. PATENT DOCUMENTS

| | | | | |
|---|---|---|---|---|
| 3,998,602 A * | 12/1976 | Horowitz et al. | ............. | 428/621 |
| 4,385,130 A * | 5/1983 | Molinski et al. | ................ | 521/31 |
| 4,701,351 A * | 10/1987 | Jackson | .......... | 430/315 |
| 5,300,140 A * | 4/1994 | Wolf et al. | ................. | 106/1.11 |
| 5,945,231 A * | 8/1999 | Narayanan et al. | ........... | 429/487 |
| 7,662,434 B2 * | 2/2010 | Ou et al. | ........................ | 427/212 |
| 2004/0146647 A1 * | 7/2004 | Fixter et al. | .................... | 427/256 |
| 2005/0107498 A1 * | 5/2005 | Kolter et al. | ...................... | 524/35 |
| 2006/0228550 A1 * | 10/2006 | Ou et al. | ........................ | 428/402 |
| 2010/0075026 A1 * | 3/2010 | Sung et al. | ................... | 427/97.2 |

FOREIGN PATENT DOCUMENTS

JP 56-152298 * 11/1981

OTHER PUBLICATIONS

Ou et al , "Uniform polystyrene microspheres decorated with noble metal nanoparticles formed without using extra reducing agent", Colloids and Surfaces A: Physicochem. Eng. Aspects 305 (2007) pp. 36-41.*

* cited by examiner

Primary Examiner — Katherine A Bareford
(74) Attorney, Agent, or Firm — Bacon & Thomas, PLLC

(57) ABSTRACT

A method for forming a metal pattern on a substrate via printing and electroless plating is disclosed, which includes printing a pattern on the substrate with an ink composition, drying the printed pattern, and contacting the dried pattern with an electroless plating solution. The ink composition either contains components (i), (ii) and (iii), components (i) and (iv), or components (i) and (v), which are dissolved or dispersed in a solvent, wherein (i) is a binder; (ii) is a sulfate terminated polymer of an ethylenically unsaturated monomer; (iii) is a catalytic metal precursor; (iv) is a polymer of an ethylenically unsaturated monomer deposited with particles of catalytic metal; and (v) is a copolymer of an ethylenically unsaturated monomer and a hydrophilic monomer deposited with particles of catalytic metal. The binder (i) is a water swellable resin. The catalytic metal may be Au, Ag, Pd, Pt or Ru.

12 Claims, 2 Drawing Sheets

METHOD FOR FORMING A METAL PATTERN ON A SUBSTRATE

FIELD OF THE INVENTION

The invention relates to a method for forming a metal pattern on a substrate via printing and electroless plating, and particularly to a method for forming a metal pattern wherein a pattern is printed on a substrate by using an ink composition comprised of catalytic metals, then forming a metal film on the printed pattern via electroless plating.

BACKGROUND OF THE INVENTION

There are currently three major research trends concerning the making of metal circuits via inkjet printing. Firstly, solutions containing metal nanoparticles may be used to print and form circuits after sintering. Secondly, a hybrid process that combines surface processing with spraying catalysts are employed, and results in metal circuits after electroless plating. Thirdly, photoresist patterns may be formed on copper clad laminates via lithography, and the laminates are etched with the photoresist patterns as the cover, thus forming metal circuits after the photoresist patterns are removed. The first method cannot be applied to flexible plastic substrates because such substrates cannot withstand the high temperature (200° C.-300° C.) necessary for sintering metal nanoparticles to form metal circuits. If laser was used to sinter circuits, production costs would be further increased due to the need for related facilities, and problems like imprecise and overlong sintering would make large-scale productions even more difficult. The third method is also inadequate for use with flexible plastic substrates, because such substrates are easily damaged by etching solutions and the acidic/basic solutions used in the lithography process. Therefore, the second method is crucial for preparing metal circuits on the flexible plastic substrates.

A method for forming metal patterns was disclosed in U.S. Patent No. US2005/015078, which includes the mixing of palladium ions with a polymer comprised of a hydrophilic polymer (like PVP) and an UV curable resin to result in an ink, and the use of a inkjet printing technique to form particular patterns onto specific areas of the substrate; the resin is then cured via UV light to form a pattern or an area that allows for deposition of a metal film; followed by the use of a reducing agent like DMBA (Dimethylamine borane) to reduce the palladium ions to palladium atoms; a metal film is finally deposited onto the pattern via electroless plating. This method is characterized in that a hydrophilic polymer like PVP is easily removed from an aqueous solution, so that the printed pattern is imparted with high porosity or highly branched tree-like structure under microscopic view. In other words, the total surface area of the pattern is greatly multiplied, and the plating reactivity of the pattern and the combination between the deposited metal layer and the pattern are significantly enhanced. However, the method requires an externally provided reducing agent and the steps thereof are more complicated.

Two previous literatures (N. R. Bieri, J. Chung, D. Poulikakos, Superlattices and Microstructures, 2004, 473-444, and S. H. Ko, J. Chung, H. Pan, Sensors and Actuators, 2006) had disclosed the use of a metal nanoparticle solution to print lead wires, and then obtaining a conductive metal circuit via laser sintering. The method is found to have following disadvantages as observed from the literatures: 1. the required facilities are expensive; 2. the time needed for making conductive circuits is long; 3. the production scale is small; 4. the metal layer obtained from sintering is thin and imperfect as well as prone to cause poor conductivity; 5. the control over alignment of sintering is difficult. Therefore, the method is not only highly complicated, but also not cost-effective.

A method for forming metal patterns is disclosed in U.S. Pat. Nos. 5,501,150 and 5,621,449, in which an ink containing a reducing agent and a compound of silver (such as silver nitrate) is printed on a substrate, and the substrate is heated under a high temperature for sintering and forming a metal pattern. However, the method easily harms common flexible plastic substrates, thus rendering the method inadequate for use with such substrates.

SUMMARY OF THE INVENTION

A primary objective of the invention is to propose a method for forming a metal pattern on a substrate via printing and electroless plating; the method utilizes an ink composition comprising catalytic metals to print a pattern on a substrate, and then forms a metal film on the printed pattern via electroless plating.

Another objective of the invention is to propose an ink and a composition thereof that may be applied to the aforesaid method of the invention.

The ink composition used in the method of the invention comprises a sulfate terminated ($SO_4^-$) polymer having a hydrophilic functional group; the polymer may be used as a reducing agent and a dispersing agent simultaneously, so that catalytic metal ions may be reduced to atoms and homogenously dispersed in the ink composition before and after printing.

BRIEF DESCRIPTION OF DRAWINGS

The structure and the technical means adopted by the present invention to achieve the above and other objectives can be best understood by referring to the following detailed description of the preferred embodiments and the accompanying diagrams, wherein.

DETAILED DESCRIPTION OF PREFERRED EMBODIMENTS

Figure 1:
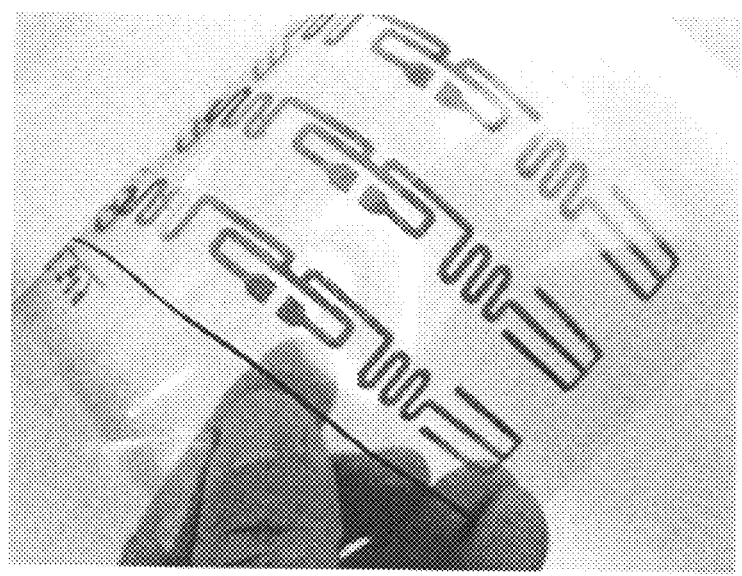
FIG. 1 is a photograph that shows a metal pattern made of copper applied to a PET substrate according to a first preferred embodiment of the invention.

The present invention provides a method for forming a metal pattern on a substrate, preferably a flexible plastic substrate, comprising the following steps:
 a. printing a pattern on a substrate with an ink composition;
 b. drying the printed pattern to obtain a hardened pattern;
 c. immersing the substrate with the hardened pattern into an electroless plating solution, so as to form a metal film on the hardened pattern;
 wherein the ink composition either contains components (i), (ii) and (iii), components (i) and (iv), or components (i) and (v), which are dissolved or dispersed in a solvent;
 wherein (i) is a binder; (ii) is a sulfate terminated polymer of an ethylenically unsaturated monomer; (iii) is a catalytic metal precursor; (iv) is a polymer of an ethylenically unsaturated monomer deposited with particles of catalytic metal; and (v) is a copolymer of an ethylenically unsaturated monomer and a hydrophilic monomer deposited with particles of catalytic metal; the binder (i) is a water swellable resin; the catalytic metal precursor (iii) is a salt or halide of gold (Au), silver (Ag), palladium (Pd), platinum (Pt), or ruthenium (Ru); and the particles of catalytic metal in (iv) and (v) are Au, Ag, Pd, Pt, or Ru. Preferably, the hydrophilic monomer of the component (v) is ethylene oxide, propylene oxide, acrylic acid, N,N-dimethylacrylamide, or N-isopropylacrylamide.

Preferably, the ink composition comprises the components (i), (ii), and (iii) dissolved or dispersed in a solvent, and the component (ii) of a sulfate terminated polymer of an ethylenically unsaturated monomer is a styrene polymer with a number average molecular weight ranging from 500 to 10000. More preferably, the styrene polymer further comprises a hydrophilic substitution group, and most preferably the hydrophilic substitution group is sodium sulfonate.

Preferably, a weight ratio of the component (i) to the component (ii) ranges from 1:10 to 10:1; and a weight ratio of the component (ii) to the component (iii) ranges from 1:1 to 20:1.

Preferably, the ink composition comprises the components (i) and (iv) dissolved or dispersed in a solvent, and the component (iv) of a polymer of an ethylenically unsaturated monomer deposited with particles of catalytic metal is a styrene polymer with a number average molecular weight ranging from 500 to 10000 that is deposited with particles of catalytic metal. More preferably, the styrene polymer further comprises a hydrophilic substitution group, and most preferably the hydrophilic substitution group is sodium sulfonate.

Preferably, a weight ratio of the component (i) to the component (iv) ranges from 1:10 to 10:1.

Preferably, the ink composition comprises the components (i) and (v) dissolved or dispersed in a solvent, and more preferably, the component (v) comprises a styrene copolymer with a number average molecular weight ranging from 5000 to 50000. Most preferably, the hydrophilic monomer is N-isopropylacrylamide.

Preferably, a weight ratio of the component (i) to the component (v) ranges from 1:10 to 10:1.

Preferably, the catalytic metal precursor (iii) is a palladium salt or palladium halide; the particles of catalytic metal of the components (iv) and (v) are palladium. The palladium salt can be acetate or nitrate.

Preferably, the water swellable resin is poly(tetrafluoroethylene) sulfonate or polystyrene sulfonate, and poly(tetrafluoroethylene) sulfonate is more preferable.

Preferably, step (c) in the method of the present invention further comprises a step of immersing the substrate with the hardened pattern into water of 35-95° C. for 3-30 minutes, and then in the electroless plating solution after the substrate is removed from the water. More preferably, the electroless plating solution of step (c) is an electroless copper plating solution, and the metal film is a copper film.

Preferably, step (c) in the method of the present invention comprises immersing the substrate with the hardened pattern into the electroless plating solution of 35-95° C. More preferably, the electroless plating solution is an electroless nickel plating solution, and the metal film is a nickel film.

The component (ii) of a sulfate terminated polymer of an ethylenically unsaturated monomer employed in the present invention is disclosed in U.S. patent application Ser. No. 11/497,308, filed 2 Aug. 2006, now U.S. Pat. No. 7,662,434 commonly owned by the applicant of the present application, the disclosure of which is incorporated herein by reference.

The invention may be further understood by referring to the following embodiments of the invention, which are provided for the sole purpose of helping explain the invention, not limiting the scope of the invention.

The First Preferred Embodiment: Preparation of the Ink Composition and the Copper Metal Pattern In this embodiment, the sulfate terminated styrene oligomer with sodium sulfonate groups (with a number average molecular weight of 1310, and a weight average molecular weight of 2880) as prepared in Example 3 of the U.S. patent application Ser. No. 11/497,308 was used.

An ink composition used for printing was prepared according to a formula listed in Table 1 below; wherein palladium chloride was used as a catalytic precursor; the sulfate terminated styrene oligomer with sodium sulfonate groups served as a reducing agent and a dispersing agent simultaneously; Nafion® DE2020 served as a water swellable binder (manufactured by DuPont, U.S.A.); 1-propanol, acetone, and water were used as solvents.

TABLE 1

| Components | Proportion (Wt %) |
|---|---|
| Palladium Chloride | 0.9 |
| Sulfate Terminated Styrene Oligomer with Sodium sulfonate Groups | 2.5 |
| Nafion ® DE2020* | 1.5 |
| 1-propanol | 10.0 |
| Acetone | 2 |
| Water | 83.1 |

*Nafion ® DE2020 is manufactured by DuPont, U.S.A., and DE2020 is the product code.

The aforesaid ink composition was printed on a thin-film substrate made of polyethylene terephthalate (PET), and an Epson inkjet printer was used for the printing; the inkjet print head was a piezoelectric compression nozzle. After the required pattern was printed, the pattern was heated in a 70° C. oven for 10 minutes so as to allow the solvents to evaporate and result in a hardened pattern of thin film. The hardened pattern was then immersed into an 80° C. water bath for 10 minutes, so that palladium ions from palladium chloride could be reduced into atomic palladium with catalytic activity.

Subsequently, a metal pattern was formed over the hardened pattern via electroless plating. Circuposit 680 is a commercially available electroless copper plating solution (Rohm Hass Co., U.S.A.), and proper additives had to be added into the plating solution in order to make the solution adequate for use with polymer substrates; for example, glycerin may be added so as to lower surface tension of the plating solution; butanol may be added as a co-solvent, or for increasing wetting capability and lowering surface tension of the plating solution, while polyethylene glycol may be added as a wetting agent. The electroless copper plating solution used in this embodiment was prepared by adding glycerin (4 wt %), n-butanol (25 wt %), and polyethylene glycol (weight average molecular weight of 2200, 6 wt %) into Circuposit 680. The PET substrate with the pattern was immersed into said electroless copper plating solution at room temperature for 15 minutes, and then a layer of copper was found to have been deposited homogeneously on and combined stably with the pattern on the PET substrate, whereas the rest of the surface of the PET substrate without the pattern did not have any copper deposited thereon, as shown in FIG. 1.

Comparison 1:

The steps of said first embodiment were repeated using a PET substrate for forming a metal pattern thereon, except that polyvinyl alcohol (PVA) was used to replace Nafion® DE2020 as the binder.

It was found that only a minute amount of copper had been poorly deposited onto the pattern on the PET substrate.

The results from the first embodiment and Comparison 1 indicated that the binder in the ink composition played a crucial role in electroless plating. After Nafion® DE2020 has hardened, hot water and plating solution were allowed to gradually permeate into the hardened pattern due to the water swellability of Nafion® DE2020, and after palladium ions had contacted with terminal sulfate groups in heating water, the palladium ions were reduced to atomic palladium, consequently allowing the catalysts to be dispersed within the pattern. When the substrate was subsequently immersed into the electroless copper plating solution, copper was precipitated out of the plating solution and gradually deposited onto the surface of the pattern, thereby forming a layer of copper film evenly and properly deposited onto the pattern. If it was necessary to add a thickening layer of copper film or further layers of different metal films like nickel films or gold films, such goals may be achieved via conventional methods such as electroplating or electroless plating. In contrast, the PVA used in Comparison 1 became more hydrophilic after hardening, which allowed hot water and plating solution to permeate into the pattern easily, consequently leading to the PVA partially dissolving in the plating solution. The partial dissolution resulted in the presence of only a small amount of remaining catalysts, thus only a minute amount of copper was poorly deposited onto the pattern in the subsequent process of electroless copper plating.

Figure 2:
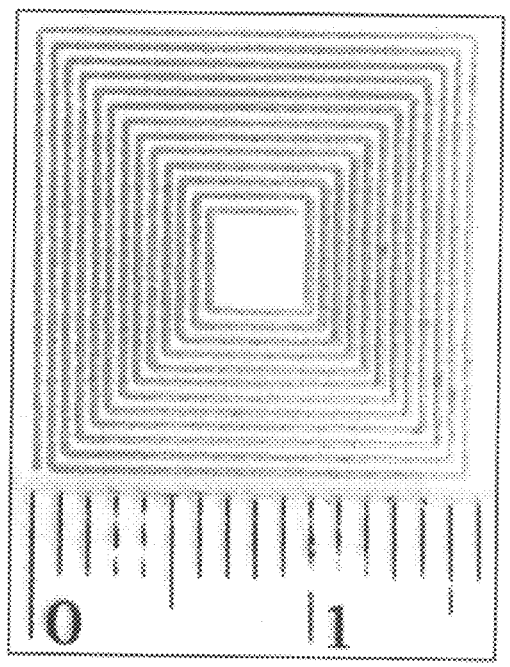
FIG. 2 is a photograph that shows a metal pattern made of nickel applied to a PET substrate according to a second preferred embodiment of the invention.

The Second Preferred Embodiment: Preparation of the Ink Composition and the Nickel Metal Pattern The ink composition prepared in the first embodiment was used to print a pattern on a PET substrate, and the pattern was heated in a 70° C. oven for 10 minutes so as to allow the solvents to evaporate and result in a hardened pattern of thin film. The PET substrate with the hardened pattern was then immersed into an 80° C. electroless nickel plating solution having the composition of Table 2 below for 10 minutes. Subsequently, a layer of nickel was observed to have been deposited evenly on and combined stably with the pattern on the PET substrate, whereas the rest of the surface of the PET substrate without the pattern did not have any nickel deposited thereon, as shown in FIG. 2.

TABLE 2

| Components | Proportion (Wt %) |
|---|---|
| Nickel Sulfate | 3 |
| Sodium Hypophosphite | 3 |
| Glycine | 1.5 |
| Sodium Lactate | 2.5 |
| Glycerin | 5 |
| Polyethylene Glycol (Mw 2200) | 5 |
| Aqueous Ammonia | 8 |
| Water | 72 |

The Third Preferred Embodiment: Preparation of the Ink Composition and the Copper Metal Pattern An ink composition was prepared according to the composition in the first embodiment, except that the palladium chloride, the sulfate terminated styrene oligomer with sodium sulfonate groups, and the water were added according to the proportions given in Table 3. The resulted mixture was heated at 80° C. for 10 minutes to obtain a colloidal suspension having styrene oligomers deposited with palladium nanoparticles. Subsequently, other ingredients listed in Table 3 were added into the suspension to result in the required ink composition, and the ink composition was used to print a pattern on a PET substrate according to the method of the first embodiment, then the substrate was heated in a 70° C. oven for 10 minutes to harden the pattern, followed by the formation of a desired copper pattern using the electroless copper plating solution according to the method of the first embodiment.

TABLE 3

| Components | Proportion (Wt %) |
|---|---|
| Palladium Chloride | 0.04 |
| Sulfate Terminated Styrene Oligomer with Sodium sulfonate Groups | 4.48 |
| Nafion ® DE2020* | 8.3 |
| 1-propanol | 6.64 |
| Acetone | 1.66 |
| Water | 75.88 |

A layer of copper was observed to have been deposited evenly on and combined stably with the pattern on the PET substrate, whereas the rest of the surface of the PET substrate without the pattern did not have any copper deposited thereon.

Figure 3:
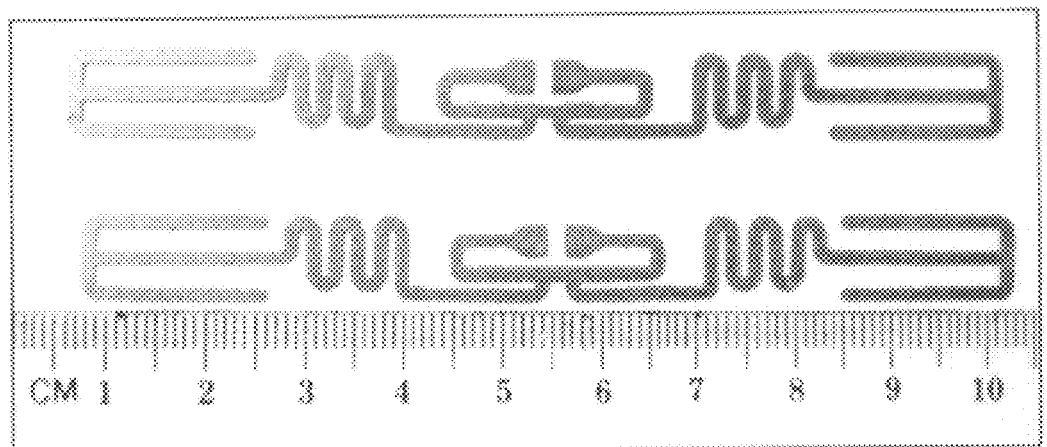
FIG. 3 is a photograph that shows a metal pattern made of nickel applied to a PET substrate according to a fourth preferred embodiment of the invention.

The Fourth Preferred Embodiment: Preparation of the Ink Composition and the Nickel Metal Pattern Mixed palladium chloride, sulfate terminated copolymer of styrene and N-isopropylacrylamide, and water according to the proportions given in Table 4, then heated the mixture at 80° C. for 5 minutes to obtain a colloidal suspension having styrene copolymers deposited with palladium nanoparticles. Subsequently, other ingredients listed in Table 4 were added into the suspension to result in the required ink composition, and the ink composition was used to print a pattern on a PET substrate according to the method of the first embodiment, then the substrate was heated in a 70° C. oven for 10 minutes to harden the pattern, followed by the formation of a desired nickel pattern using the electroless nickel plating solution according to the method of the second embodiment; as shown in FIG. 3.

TABLE 4

| Ingredients | Proportion (Wt %) |
|---|---|
| Palladium Chloride | 0.02 |
| Sulfate Terminated Styrene Copolymer | 6.5 |
| Nafion ® DE2020* | 8.3 |
| 1-propanol | 0.18 |
| Water | 85 |

The sulfate terminated copolymer of styrene and N-isopropylacrylamide used in this embodiment was prepared as follows: Mixed 1 ml of styrene monomer (SM) with 1 g of N-isopropylacrylamide monomer (molar ratio of SM:N-isopropylacrylamide=1.05:1). Then mixed 60 ml of $3 \times 10^{-3}$ M aqueous KPS solution (potassium persulfate) with the resulted mixture of monomers, and left the resulting solution in a 75° C. oil bath for 8 hours for the solution to react, thereby obtaining the sulfate terminated copolymer of styrene and N-isopropylacrylamide.

Figure 4:
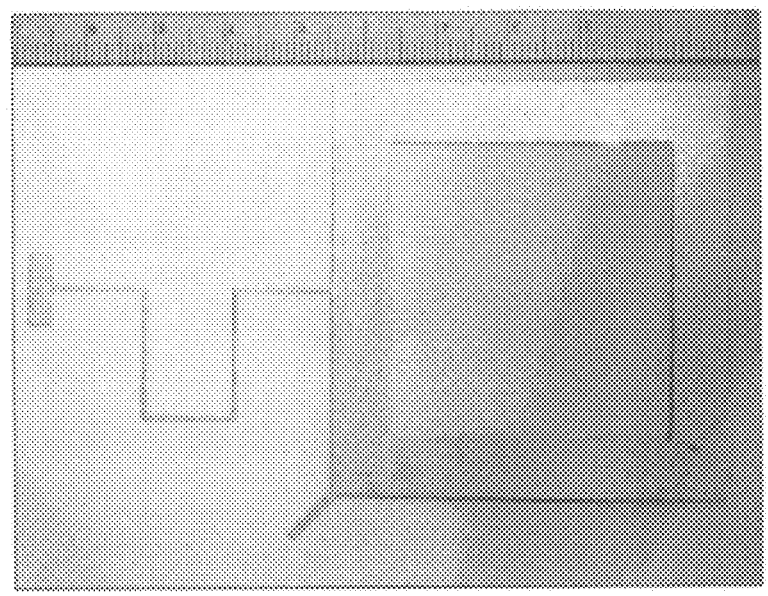
FIG. 4 is a photograph that shows a metal pattern made of copper applied to a PET substrate according to a fifth preferred embodiment of the invention.

The Fifth Preferred Embodiment: Preparation of the Ink Composition and the Copper Metal Pattern The electroless copper plating solution of the first embodiment was used to replace the electroless nickel plating solution of the fourth embodiment, and then the steps of the fourth embodiment were repeated using a PET substrate for forming a copper pattern thereon, as shown in FIG. 4.

Although a preferred embodiment of the invention has been described for purposes of illustration, it is understood that various changes and modifications to the described embodiment can be carried out without departing from the scope and the spirit of the invention as disclosed in the appended claims.

What is claimed is:

1. A method for forming a metal pattern on a substrate, comprising the following steps:
    a. printing a pattern on a substrate with an ink composition, wherein the ink composition comprises (i) a binder, (ii) a sulfate terminated polymer of an ethylenically unsaturated monomer, and (iii) a catalytic metal precursor, and wherein the binder is a water swellable resin and the catalytic metal precursor is a salt or halide of gold (Au), silver (Ag), palladium (Pd), platinum (Pt), or ruthenium (Ru);
    b. drying the printed pattern to obtain a substrate with a hardened pattern;
    c. immersing the substrate with a hardened pattern into water of 35-95° C. for 3-30 minutes to swell the hardened pattern and to reduce the catalytic metal precursor;
    d. removing the substrate with a hardened pattern from the water; and then
    e. immersing the substrate with a hardened pattern into an electroless plating solution so as to form a metal film on the hardened pattern.

2. The method of claim 1, wherein the ink composition comprises the components (i), (ii), and (iii) dissolved or dispersed in a solvent, and the component (ii) of a sulfate terminated polymer of an ethylenically unsaturated monomer is a styrene polymer with a number average molecular weight ranging from 500 to 10000.

3. The method of claim 2, wherein the styrene polymer further comprises a hydrophilic substitution group.

4. The method of claim 3, wherein the hydrophilic substitution group is sodium sulfonate.

5. The method of claim 2, wherein a weight ratio of the component (i) to the component (ii) ranges from 1:10 to 10:1; and a weight ratio of the component (ii) to the component (iii) ranges from 1:1 to 20:1.

6. The method of claim 1, wherein the catalytic metal precursor (iii) is a palladium salt or palladium halide.

7. The method of claim 1, wherein the water swellable resin is poly(tetrafluoroethylene) sulfonate or polystyrene sulfonate.

8. The method of claim 7, wherein the water swellable resin is poly(tetrafluoroethylene) sulfonate.

9. The method of claim 1, wherein the electroless plating solution of step e. is an electroless copper plating solution, and the metal film is a copper film.

10. The method of claim 1, wherein the electroless plating solution is an electroless nickel plating solution, and the metal film is a nickel film.

11. The method of claim 1, wherein the substrate is a flexible plastic substrate.

12. The method of claim 1, wherein the catalytic metal precursor (iii) is a salt of palladium, and the palladium salt is acetate or nitrate.

* * * * *